United States Patent [19]

Colandrea et al.

[11] Patent Number: 5,172,018
[45] Date of Patent: Dec. 15, 1992

[54] CURRENT CONTROL DEVICE PARTICULARLY FOR POWER CIRCUITS IN MOS TECHNOLOGY

[75] Inventors: Francesco Colandrea, Segrate; Vanni Poletto, Camino, both of Italy

[73] Assignee: SGS-Thomson Microelectronics S.r.l, Milan, Italy

[21] Appl. No.: 835,654

[22] Filed: Feb. 13, 1992

[30] Foreign Application Priority Data

Feb. 18, 1991 [IT] Italy ............................ MI91A000408

[51] Int. Cl.[5] ...................... H03K 17/687; H03K 3/01; H03K 17/56; H03K 5/153
[52] U.S. Cl. .................................... 307/571; 307/573; 307/246; 307/270; 307/264; 307/359; 307/296.6; 307/296.8
[58] Field of Search ............... 307/571, 573, 574, 577, 307/270, 246, 264, 296.6, 296.8, 359

[56] References Cited

U.S. PATENT DOCUMENTS

| | | | |
|---|---|---|---|
| 4,527,074 | 7/1985 | Donaldson et al. | 307/246 |
| 4,736,121 | 4/1988 | Cini et al. | 307/246 |
| 4,785,207 | 11/1988 | Eng | 307/246 |
| 4,808,839 | 2/1989 | Dunn et al. | 307/246 |

Primary Examiner—Andrew J. James
Assistant Examiner—Trong Phan
Attorney, Agent, or Firm—Townsend and Townsend

[57] ABSTRACT

Current control device particularly for power circuits in MOS technology, which comprises a MOSFET transistor which has its source terminal connected to one terminal of a dissipative load, its gate terminal connected to a pump circuit which receives in input a supply voltage and a square-waveform voltage, and its drain terminal connected to a power supply. The device furthermore comprises a control circuit which is coupled to the MOSFET transistor by means of an electrical connection and generates signals for adjusting the supply voltage and the square-waveform voltage of the pump circuit.

4 Claims, 3 Drawing Sheets

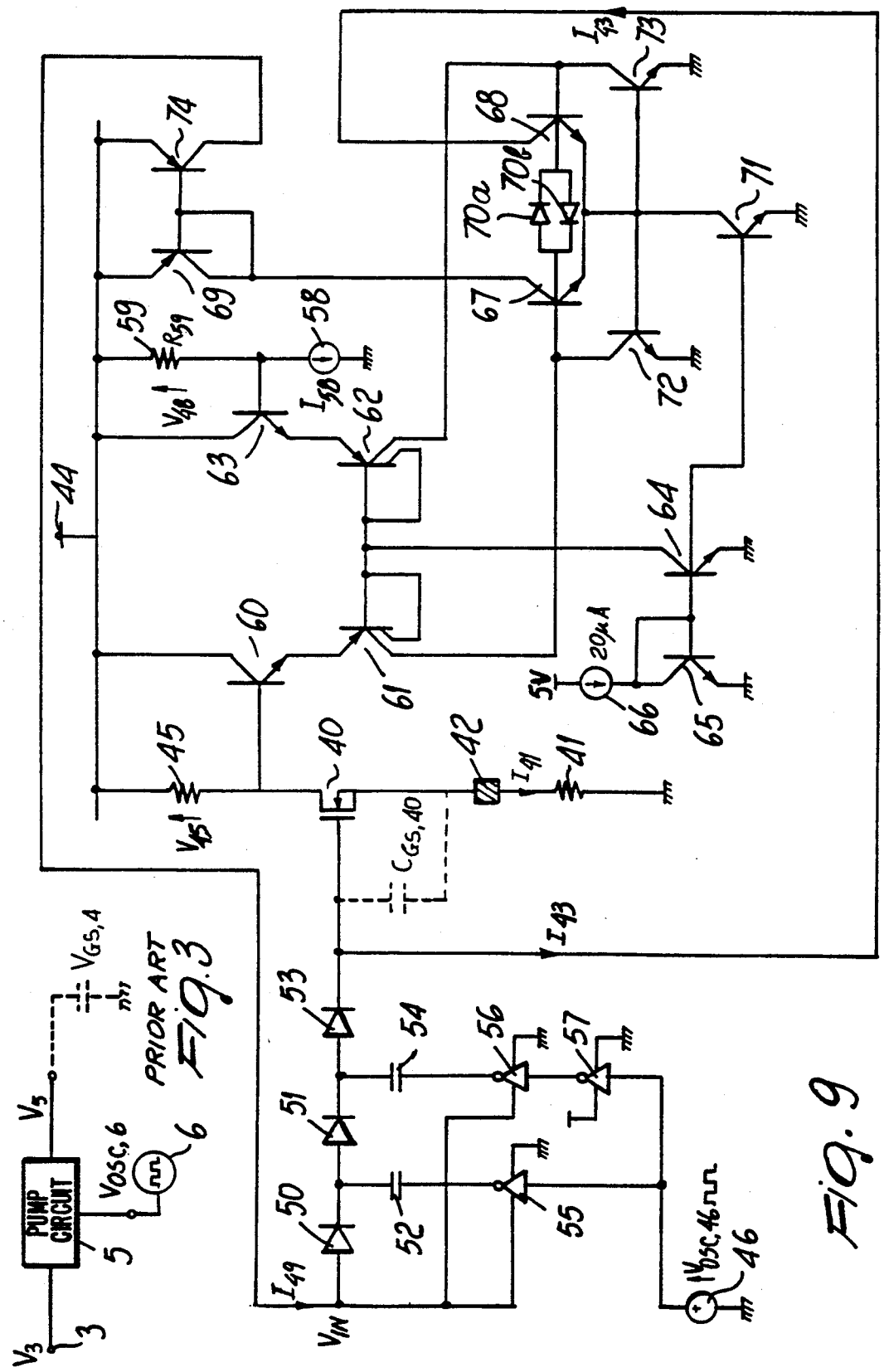

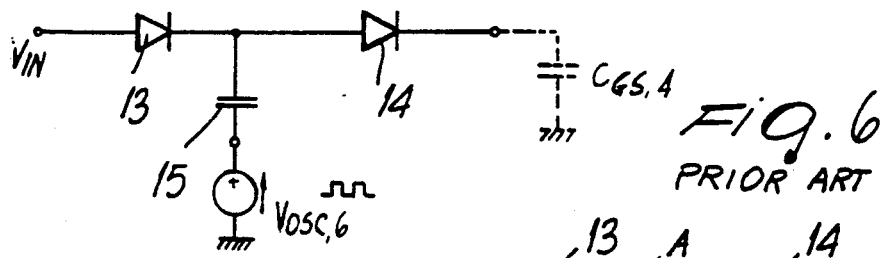
Fig. 6 PRIOR ART
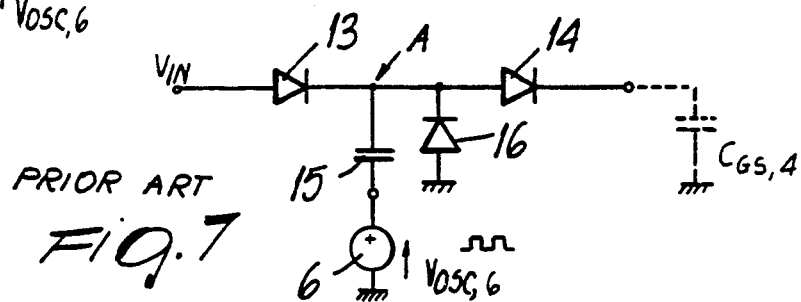
PRIOR ART Fig. 7
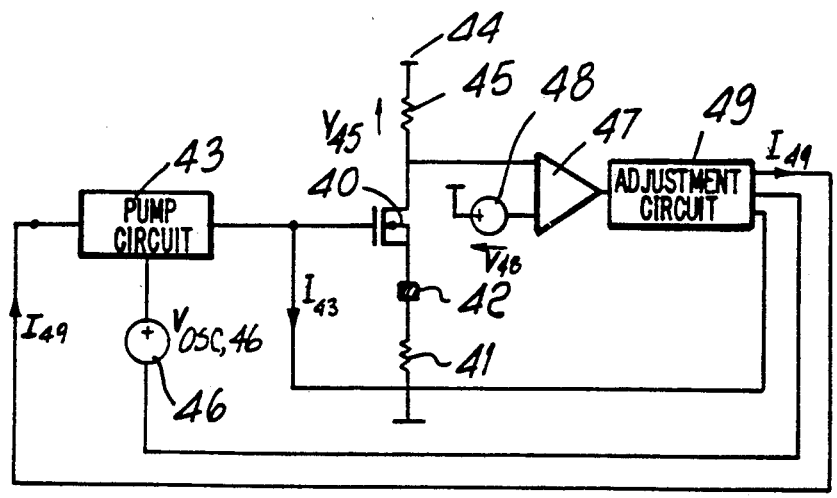
Fig. 8
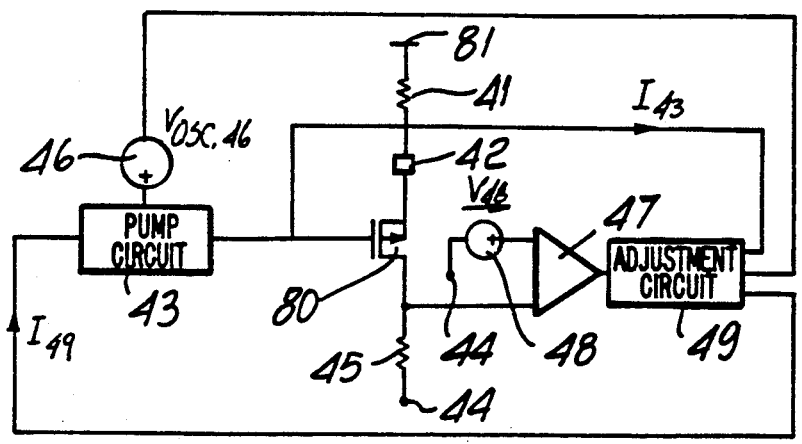
Fig. 10

CURRENT CONTROL DEVICE PARTICULARLY FOR POWER CIRCUITS IN MOS TECHNOLOGY

BACKGROUND OF THE INVENTION

The present invention relates to a current control device particularly for power circuits in MOS technology.

Power devices in MOS technology (MOS being the acronym of Metal Oxide Semiconductor) are currently used to drive loads with fixed or variable impedance; said devices have various configurations, the most interesting of which, from a strictly applicative point of view, are those known in the art as high-side driver and low-side driver, i.e. driving circuits in which the load or impedance element respectively has an electrode or terminal connected to the negative pole of the power supply and has a terminal connected to the positive pole of the power supply.

Power devices for driving loads with fixed or variable impedance often require a circuit for controlling the delivered current. This control circuit assumes various functions, such as protecting the device from overloads, increasing the duration of the life of the load, and limiting electromagnetic emissions when switching the load on and/or off.

Power circuits usually comprise a final power stage constituted by an N-channel or P-channel MOSFET transistor. In the case of a high-side driver with an N-channel MOSFET transistor, the source terminal constitutes the output of the power circuit to which a terminal of the load is connected.

Providing current control in a monolithic integrated circuit without the aid of external components entails a problem which is difficult to solve, i.e. the problem of frequency stability. There are two different possibilities for providing frequency compensation in the current control loop which acts on the gate-source voltage of the MOSFET transistor. The first one is to drive said voltage with a low impedance, using a classic operational amplifier compensated by an internal capacitor. The other one entails high-impedance driving, using the gate-source capacitor which is intrinsic in the MOSFET transistor itself for compensation.

The first solution has a substantial problem, i.e. the provision of an integrated capacitor of a sufficiently high value, such as to produce a dominant pole. In this case, the use of the gate-source capacitor of the MOSFET transistor as load makes this aim very difficult, since the value of the gate-source capacitor is generally very high with respect to the integrated capacitors, which can attain at the most a few tens of picofarads, whereas the gate-source capacitor is proportional to the area occupied by the MOSFET transistor, which cannot be economically sacrificed merely to provide a compensation capacitor.

Compensation provided with the first solution is applied only in the case of very small MOSFET transistors, i.e. in the case of driving circuits for currents of a few milliamperes.

It has furthermore been observed so far that the second solution is also not excessively effective. Only circuits provided with physically very large MOSFET transistors, with gate-source capacitor values of several nanofarads, have in fact been found to be stable in practical application, whereas the necessary frequency stability is not achieved for integrated circuits having MOSFET transistors of intermediate dimensions.

Therefore, the real technical problem consists of the intermediate capacitor values, which so far are not covered by the first described solution or by the second one.

SUMMARY OF THE INVENTION

The aim of the present invention is to eliminate or substantially reduce the problems described above in known types of compensation circuits by providing a current control device particularly for power circuits in MOS technology which allows current control, and therefore frequency control, over a wide range of current values.

Within the scope of the above aim, an object of the present invention is to provide a current control device which eliminates the frequency instability problems which are currently observed.

Not least object of the present invention is to provide a current control device which is relatively easy to manufacture and at competitive costs.

This aim, the objects mentioned and others which will become apparent hereinafter are achieved by a current control device particularly for power circuits in MOS technology, according to the invention, as defined in the accompanying claims.

BRIEF DESCRIPTION OF THE DRAWINGS

Further characteristics and advantages of the invention will become apparent from the description of a preferred but not exclusive embodiment of a current control device particularly for power circuits in MOS technology, according to the invention, illustrated only by way of non-limitative example in the accompanying drawings, wherein:

FIG. 3 is a circuit diagram of a known pump circuit;

FIG. 6 is an example of a known elementary pump circuit;

FIG. 7 is an example of a known monolithically integrated pump circuit;

FIG. 8 is a circuit diagram of a current control device for a high-side driver according to the invention;

FIG. 9 is an embodiment of the circuit of FIG. 8; and

FIG. 10 is a circuit diagram of a current control device for a low-side driver according to the invention.

DESCRIPTION OF THE PREFERRED EMBODIMENTS

Figure 1A:
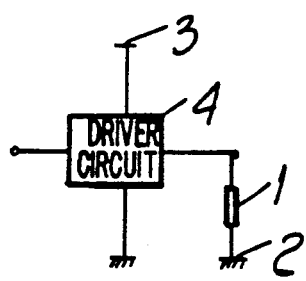
FIGS. 1a and 1b are schematic diagrams of known highside driver and low-side driver circuits respectively.
Figure 1B:
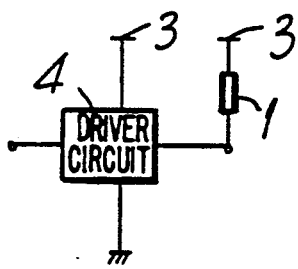

The types of power driver discussed are those illustrated in FIGS. 1a and 1b, i.e. respectively a high-side driver and a low-side driver. In the first case (the high-side driver) as shown in FIG. 1a, the load 1 is connected between the output the negative pole terminal of the driver circuit 4 and 2 of the power supply, whereas in the other case (the low-side driver) as shown in FIG. 1b, the load 1 is connected between the output the positive pole terminal of the driver circuit 4 and 3 of the power supply.

The possible combinations which affect the present invention are a high-side driver with N-channel MOSFET transistor (where MOSFET is the acronym of Metal Oxide Semiconductor Field-Effect Transistor) and a low-side driver with P-channel MOSFET transistor.

Due to technological reasons, driving devices provided by means of monolithic integrated circuits use MOSFET transistors with a reinforced N-channel commonly known in the art as enhancement N-channel MOSFETS. Accordingly, for the sake of simplicity in the description of the known art and of the present invention, the high-side driver with NO channel MOSFET transistor will always be discussed hereinafter, whereas only an embodiment of the present invention will be described for the low-side driver with P-channel MOSFET transistor.

Figure 2:
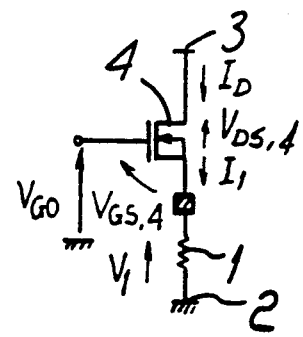
FIG. 2 is a circuit diagram of a final power stage of a known high-side driver.

With reference to FIG. 2, a load 1 has one terminal connected to the negative pole 2 of the power supply, which for the sake of simplicity in exposition is hereinafter considered as the ground. The driver, or rather the MOSFET transistor 4, connects the other terminal of the load 1 to the positive pole 3 of the power supply, ensuring a low voltage drop, equal to the drain-source voltage $V_{DS,4}$, on the MOSFET transistor 4 in order to maximize the power $P_3$ dissipated in the load and, accordingly, minimize the power $P_4$ dissipated on the MOSFET transistor 4.

In order to ensure a low voltage drop across the MOSFET transistor 4, said transistor must operate in the linear range. Therefore the gate-source voltage $V_{GS,4}$ must comply with the following inequality:

$$V_{GS,4} - V_{DS,4} > V_{TH}$$

where $V_{TH}$ is the activation threshold voltage of the MOSFET transistor 4. Typically, $V_{GS,4}$ must be in the range of approximately 10 volts. Therefore, if $V_{GS,4} = 10$ volts:

$$V_{GO} = V_{GS,4} + V_1$$

and $$V_1 = V_3 - V_{DS,4}$$

from which, ignoring the drain-source voltage $V_{DS,4}$, one obtains:

$$V_{GO} = V_3 + 10 \text{ volts.} \quad (R1)$$

$V_{GO}$ designates the potential of the gate terminal of the MOSFET transistor 4 with respect to the ground, $V_1$ designates the voltage across the load 1 and $V_3$ designates the supply voltage provided by the power supply 3.

A direct consequence of relation R1 is that the voltage applied to the gate terminal of the MOSFET transistor 4 must exceed the power supply voltage $V_3$ by at least 10 volts. In order to obtain this voltage which is higher than the supply voltage, it is necessary to adopt a pump circuit 5, illustrated schematically in FIG. 3.

The pump circuit 5 is powered by the supply voltage $V_3$ and requires a voltage $V_{OSC,6}$ which arrives from a squarewave oscillator designated by the reference numeral 6 in FIG. 3. The voltage V5 in output from the pump circuit 5 is thus equal, negligible drops excepted, to:

$$V_5 = V_3 + n * V_{OSC,6}$$

where n is a natural number. If the amplitude of the square wave $V_{OSC,6}$ is equal to $V_3$, the voltage $V_5$ in output from the pump circuit 5 is a multiple of the supply voltage $V_3$. In order to control the current $I_1$ it is necessary to measure it and act on the gate-source voltage $V_{GS,4}$ of the MOSFET transistor 4. When current control is activated, the MOSFET transistor 4 operates in the saturation area, where the current $I_D$ which flows in the N-channel of said transistor is equal to:

$$I_D = g_m * V_{GS,4} \quad (R2)$$

where $g_m$ is the transconductance of the saturated MOSFET transistor 4. The saturated operation condition of the MOSFET transistor 4 is given by the following inequality:

$$V_{GS,4} - V_{DS,4} < V_{TH}. \quad (R3)$$

In this saturation condition, the MOSFET transistor 4 behaves like a voltage-controlled current source.

Figure 4:
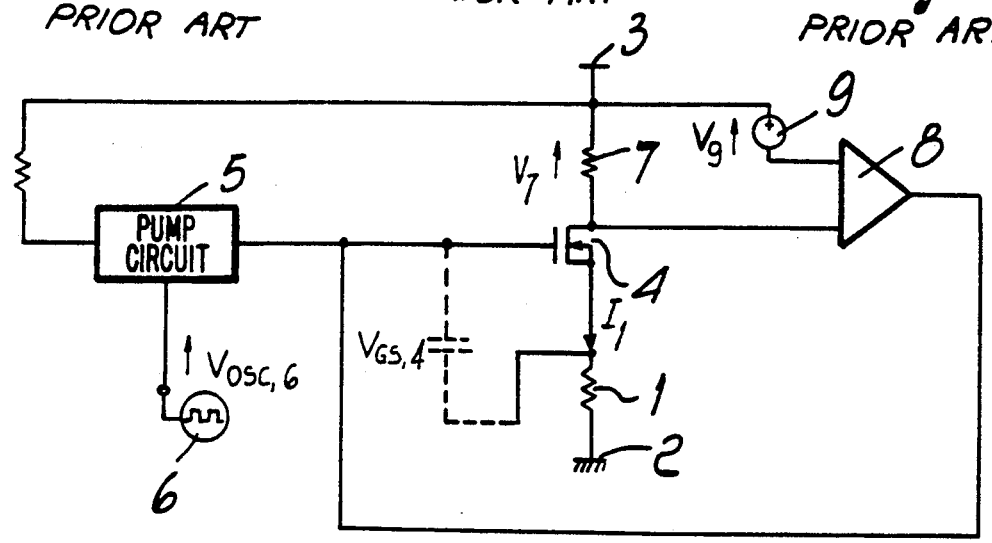
FIG. 4 is a circuit diagram of a known current adjustment circuit.

FIG. 4 is a diagram of a conventional current control device which uses the gate-source capacitor $C_{GS,4}$ of the MOSFET transistor 4 for frequency compensation.

The current $I_1$ is detected by measuring the voltage drop $V_7$ across a resistor 7 which is arranged in series to the drain terminal of the MOSFET transistor 4 and to the load 1. The voltage $V_7$ is compared, in a control circuit 8, source 9.

If the voltage $V_7$ is lower than the reference voltage $V_9$, current control is inactive and the MOSFET transistor 4 operates in its linear area.

If instead the voltage $V_7$ tries to exceed the reference voltage $V_9$, i.e. if the current $I_1$ tends to the maximum set value, current control intervenes and adjusts the voltage $V_{GS,4}$ by discharging the capacitor $C_{GS,4}$ of the MOSFET transistor 4 with a current which is proportional to the error voltage $V_7-V_9$. The MOSFET transistor 4 enters the saturation area, as indicated by the above relations R2 and R3, and the current $I_1$ is thus set to a value which is proportional to $V_9$.

Figure 5:
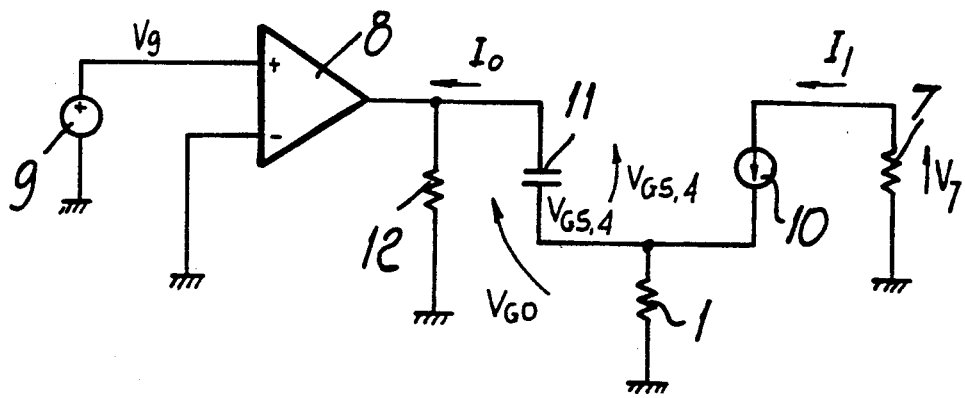
FIG. 5 is a model of the known open-loop adjustment circuit.

Assume the pump circuit 5 to be temporarily inactive, i.e. $V_{OSC,6} = 0$. FIG. 5 illustrates a simplified model for small-signal electrical analysis of the open-loop adjustment circuit of FIG. 4. The MOSFET transistor 4 is modelled, in this particular context, by means of a voltage-controlled current source 10 with an input capacitor 11 which has a capacitance $C_{GS,4}$, and the current $I_1$ is given by the relation R2. The adjustment circuit is approximated by the differential stage 8, which has a transfer function $G_O(s)$ and an output impedance 12 whose value is $R_{12}$.

The current $I_0$ which enters the differential stage is equal to:

$$I_0 = G_O(s) * V_9$$

and if $g_O$ designates the direct-current transconductance of the differential stage 8, said transconductance is given by:

$$g_0 = G_O(s=0).$$

The voltage $V_{GO}$ is then given by the following relation, obtained from the well-known theory of open-loop control circuits:

$$V_{GO}=I_O * (R_{12} * (1+s * R_1 * C_{GS,4}))/(1+S * C_{GS,4} * (R_{12}+R_1))$$

and since $R_{12} >> R_1$, it is possible to ignore $R_1$ in the denominator in the preceding relation. Furthermore, the mathematical zero of the numerator, i.e. $(1+s * R_1 * C_{GS,4})$, is at very high frequencies, the following relation is obtained from the preceding one:

$$V_{GO}=I_O * R_{12}/(1+S * C_{GS,4} * R_{12}) \quad (R4)$$

Relation R2 leads to the following:

$$I_1=g_m * V_{GS,4}=g_m * (V_{GO}-I_1 * R_1)$$

i.e.

$$I_1=g_m/(1+g_m * R_1) \quad (R5)$$

The voltage drop across the resistor 7 is furthermore given by:

$$V_7=I_1 * R_7 \quad (R6)$$

By combining relations R4, R5 and R6, the following is obtained:

$$V_7=V_9 * G_O(s) * g_m * R_7 * R_{12}/((1+g_m * R_1)(1+S * C_{GS,4} * R_{12})) \quad (R7)$$

In relation R7, the multiplier of $V_9$, which we will designate with A(s), is the open-loop transfer function of the circuit of FIG. 5 and therefore of the circuit of FIG. 4. The transfer function is therefore:

$$A(s)=G_O(s) * g_m * R_7 * R_{12}/((1+g_m * R_1)(1+S * C_{GS,4} * R_{12}))$$

The direct-current gain of the open-loop circuit is given by:

$$A(s=0)=g_O * g_m * R_7 * R_{12}/(1+g_m * R_1) \quad (R8)$$

and this last value determines the precision of the closed-loop control. Precise current control means obtaining a very small error voltage $V_7-V_9$ which tends toward zero. This fact is achieved with a high value of $A(s=0)$. In relation R8, the values $g_m$, $R_7$, $R_{12}$ and $R_1$ are known, and therefore in order to obtain a high value of $A(s=0)$ in the transfer function it is necessary to act on $g_o$, i.e. the direct-current transconductance of the differential stage 8 must be high.

Frequency stability depends on the bandwidth $w_b$, which is equal to:

$$w_b=g_o * g_m * R_7/(C_{GS,4} * (1+g_m * R_1)) \quad (R9)$$

i.e. the passband $w_b$ of the circuit depends on the capacitance $C_{GS,4}$ of the MOSFET transistor 4 and again on the direct-current transconductance $g_o$ of the differential stage 8.

Therefore, in order to improve frequency stability it is necessary to reduce the band, i.e. $w_b$, and this entails increasing the capacitance $C_{GS,4}$.

However, a high direct-current transconductance $g_o$ leads the closed-loop circuit toward instability, since the passband $w_b$ is proportional to said transconductance $g_o$, as is evident from relation R9.

The conclusions of the exposition, described above for relations R8 and R9, lead us to the conclusion that one faces the situation of having contrasting requirements in order to obtain precision in current control and in frequency stability.

It should in any case be noted that the passband $w_b$ increases as the load 1 constituted by the resistor $R_1$ decreases. Therefore, the band is maximum when the load 1 is shorted, further aggravating the instability problems.

The pump circuit 5, a conceptual diagram of which is provided in FIG. 6, charges the capacitor $C_{GS,4}$ of the MOSFET transistor 4 with a current which is independent of the adjustment circuit. This current, hereinafter designated by $I_5$, constitutes a non-linearity factor and requires a further increase in the value of $A(s=0)$ for precise current control, to the further detriment of frequency stability.

The pump circuit illustrated in FIG. 6 comprises a first diode 13, whose anode constitutes the input terminal of the pump circuit 5. The cathode of the first diode 13 is connected to the anode of a second diode 14 and to a terminal of a capacitor 15. The other terminal of the capacitor 15 is connected to the output terminal of the voltage source/square-wave oscillator 6.

The cathode of the output terminal is connected to the gate terminal of the MOSFET transistor 4, represented in FIG. 6 by a capacitor which has a capacitance $C_{GS,4}$. The voltage in output from the pump circuit 5 is thus equal to:

$$V_{GO}=V_{IN}+V_{OSC,6},$$

ignoring voltage drops across the diodes 13 and 14 and designating with $V_{IN}$ the voltage in input to the anode of the first diode 13.

In some applications, an attempt has been made to switch off the power supply of the pump circuit 5 when current control is activated, with the aim of reducing the open-loop gain $A(s=0)$ necessary for the required precision. This attempt, performed within the scope of monolithic integrated circuits, has practically failed.

Indeed, with reference to FIG. 7, if the input current is eliminated, allowing the power supply $V_{IN}$ to float, apparently the pump circuit 5 should switch off. Actually, the square wave generated by the oscillator 6, which has the value $V_{OSC,6}$, causes the node A, designated in FIG. 7, to drop below the ground value during a half-period of the oscillation, thus causing the conduction of a parasitic diode 16, since any monolithically integrated component has a respective parasitic diode associated with the substrate. The current required to charge the capacitor $C_{GS,4}$ is provided by the ground, and the pump circuit thus continues to operate.

With reference to FIG. 8, a control device according to the invention comprises an N-channel MOSFET transistor 40 whose source terminal is connected to a terminal of a dissipative load 41 which is external to the integrated circuit and is connected thereto by means of a connecting pin 42. The other terminal of the dissipative load 41 is connected to the ground.

The gate terminal of the N-channel MOSFET transistor 40 is connected to a pump circuit 43, and the drain terminal is connected to a power supply 44 by means of a resistor 45. The pump circuit 43 receives in input a direct-current supply voltage $V_{IN}$ and a power supply voltage $V_{OSC,46}$ which has a square waveform generated by a source 46 of a voltage having a square waveform.

The device furthermore comprises a control circuit 47 whose inputs are at a voltage $V_{45}$ detected by the resistor 45 and a reference voltage $V_{48}$ generated by a reference voltage source 48.

The device finally comprises an adjustment circuit 49, which can be for example a differential amplifier, whose inputs are at an error voltage $V_{47}$ produced by the control circuit 47 and an adjustment current $I_{43}$ which arrives, by means of an electrical connection, from the gate terminal of the N-channel MOSFET transistor 40. The current $I_{43}$ which arrives from the gate terminal of the MOSFET transistor 40 is the discharge current of the capacitor $C_{GS,40}$, i.e. it is the discharge current of the intrinsic capacitor which is present in said transistor 40.

The adjustment circuit 49 generates signals for adjusting the direct-current supply voltage and the square-waveform supply voltage $V_{OSC,46}$ of the pump circuit 43.

With reference to FIG. 9, the pump circuit 43 comprises a first diode 50, whose anode receives the direct-current supply voltage $V_{IN}$ arriving from the adjustment circuit 49 in the form of a current $I_{49}$; a second diode 51, whose anode is connected to a node constituted by the cathode of the first diode 50 and by a terminal of a first capacitor 52; and a third diode 53, whose anode is connected to a node which is constituted by the cathode of the second diode 51 and by a terminal of a second capacitor 54.

The other terminal of the first capacitor 52 is connected to a first inverting logic gate 55 which receives in input the square-waveform supply voltage $V_{OSC,46}$; said capacitor 52 is supplied by the direct supply voltage $V_{IN}$.

The second capacitor 54 has its other terminal connected to a second inverting logic gate 56 which is also supplied by the direct-current supply voltage $V_{IN}$. The second inverting logic gate 56 has its input terminal connected to the output terminal of a third inverting logic gate 57 which is supplied by a 5-volt supply voltage and has the square-waveform supply voltage $V_{OSC,46}$ as input. The first inverting logic gate 55, the second inverting logic gate 56 and the third inverting logic gate 57, together with the source 46, form the source of the square-waveform voltage.

The above adjustment signals are constituted by a current which supplies said first inverting gate 55 and said second inverting gate 56 as well as the first diode 50. Said current $I_{49}$ continuously varies the amplitude of the oscillating voltage in output from the first inverting gate 55 and from the second inverting gate 56.

In FIG. 9, the parts related to the reference voltage source 48, the control circuit 47 and the adjustment circuit 49 are given by way of example, since they in fact depend on the specifications of the particular execution of the circuit.

The reference voltage source 48 comprises a constant-current source 58 which has one terminal connected to the ground and the other terminal connected, by means of a resistor 59, to the supply voltage 44.

The control circuit 47 comprises a first NPN transistor 60 (NPN being the acronym of Negative Positive Negative) which has its collector terminal connected to the power supply 44, its base terminal connected to the drain terminal of the MOSFET transistor 40 and its emitter terminal connected to the emitter terminal of a second PNP transistor 61 (PNP being the acronym of Positive Negative Positive). The base terminal of the second PNP transistor 61 is connected to the base terminal of a third PNP transistor 62 whose emitter terminal is connected to the emitter terminal of a fourth NPN transistor 63. The collector terminal of the fourth NPN transistor 63 is connected to the power supply 44, whereas the base terminal is connected between the constant-current source 58 and the resistor 59.

The node constituted by the base terminals of the second PNP transistor 61 and of the third PNP transistor 62 is furthermore connected to the collector terminal of a fifth NPN transistor 64 whose emitter terminal is connected to the ground, whereas its base terminal is connected to the base and collector terminals of a sixth NPN transistor 65. Said NPN transistor 65 has its collector and base terminals shorted together so as to constitute a diode-connected transistor, and has its emitter terminal connected to the ground. The base and collector terminals of the sixth NPN transistor 65 are furthermore connected to a constant-current source 66 which has the value of 20 microamperes and is driven by the 5-volt power supply.

The adjustment circuit 49 comprises a seventh NPN transistor 67 which has its base terminal connected to the collector terminal of the second PNP transistor 61, its emitter terminal connected to the emitter terminal of an eighth NPN transistor 68 and its collector terminal connected to the collector and base terminals of a ninth diode-connected PNP transistor 69. The base terminals of the seventh NPN transistor 67 and of the eighth NPN transistor 68 are connected to a fourth diode 70a and to a fifth diode 70b, whose anodes are connected to each other's cathodes. The collector terminal of a tenth NPN transistor 71 is connected to the node constituted by the interconnected emitter terminals of the seventh NPN transistor 67 and of the eighth NPN transistor 68; the base terminal of said tenth NPN transistor 71 is connected to the base terminal of the fifth NPN transistor 64, and its emitter terminal is connected to the ground.

An eleventh NPN transistor 72 has its collector terminal connected to the base terminal of the seventh NPN transistor 67, its emitter terminal connected to the ground and its base terminal connected to the collector terminal of the tenth NPN transistor 71. A twelfth NPN transistor 73 has its collector terminal connected to the base terminal of the eighth NPN transistor 68, its emitter terminal connected to the ground and its base terminal connected to the collector terminal of the tenth NPN transistor 71.

The base terminal of the eighth NPN transistor 68 is furthermore connected to the collector terminal of the third PNP transistor 62, whereas the collector terminal is connected to the gate terminal of the N-channel MOSFET transistor 40. The discharge current $I_{43}$ of the capacitor $C_{GS,40}$ flows in the connection between the gate terminal of the N-channel MOSFET transistor 40 and the collector terminal of the eighth NPN transistor 68.

The ninth PNP transistor 69 has its emitter terminal connected to the power supply 44, whereas its base terminal, which is shorted together with its collector terminal, is connected to the base terminal of a thirteenth PNP transistor 74 whose emitter terminal is connected to the power supply 44, whereas its collector terminal is connected to the anode of the first diode 50, to the power supply of the first inverting gate 55 and to the power supply of the second inverting gate 56. This connection to the power supplies of the inverting gates 55 and 56 allows to adjust the amplitude of the voltage $V_{OSC,46}$, whose waveform is modified by said inverting gates, by continuously modifying the power supply itself of said inverting gates 55 and 56. The current $I_{49}$ flows in this last connection and controls the operation of the pump circuit 43, as described and further explained hereinafter.

From what has been described above in relation to FIGS. 8 and 9, it is evident that both the current which supplies the pump circuit 43, i.e. the current $I_{49}$, and the amplitude of the square wave which the source 46 sends to said pump circuit are controlled, and this advantageously allows to reduce the charging current of the capacitor $C_{GS,40}$ in order to control the current and obtain a valid response to the opposite requirements which became apparent during the previous discussion of the phenomena from a theoretical point of view.

In practice, when the current I41 which flows within the load 41 approximates the threshold value, i.e. when the voltage drop $V_{45}$ across the resistor 45 tends to reach the reference voltage $V_{48}$ generated by the voltage source 48, in addition to the classic type of control, which discharges the capacitor $C_{GS,40}$ by means of the current $I_{43}$, the current $I_{49}$ is also simultaneously limited, thus reducing the supply voltage $V_{IN}$ of the pump circuit, and at the same time the amplitude of the input voltage $V_{GO}$ to the MOSFET transistor 40 is limited.

When the impedance of the load 41 drops below a minimum value, the voltage $V_{OSC,46}$ drops to zero and the pump circuit 43 is off, since:

$$V_{GO} = V_{IN} + V_{OSC,46}.$$

With reference to FIG. 10, a current control device for a low-side driver with a P-channel MOSFET transistor is complementary to the circuit of FIG. 8. In the following description, the components of the currently described circuit assume the same numerals as in the diagram of FIG. 8, except for explicit variations, for the sake of simplicity in exposition and of clarity of the formulas and operation described above.

The device according to the invention in fact comprises a P-channel MOSFET transistor 80 whose source terminal is connected to one terminal of the dissipative load 41, whose other terminal is connected to a power supply voltage 81. The gate terminal of the P-channel MOSFET transistor 80 is connected to the pump circuit 43 and the drain terminal is connected to a negative power supply 44 by means of a resistor 45. The pump circuit 43 receives in input a direct-current supply voltage $V_{IN}$ (by means of $I_{49}$) and a square-waveform supply voltage $V_{OSC,46}$.

The device furthermore comprises the control circuit 47, whose inputs are a voltage $V_{45}$ drawn from the resistor 45 and a reference voltage $V_{48}$ generated by a reference voltage source 48. The device finally comprises the adjustment circuit 49, whose inputs are an error voltage produced by the control circuit 47 and an adjustment current $I_{43}$ which arrives, by means of an electric connection, from the gate terminal of the N-channel MOSFET transistor 80.

The adjustment circuit 49 generates adjustment signals, i.e. the current $I_{49}$ as previously described, for the direct-current supply voltage $V_{IN}$ and for the square-waveform supply voltage $V_{OSC,46}$ of the pump circuit 43.

The described embodiments, both for the high-side driver and for the low-side driver, lead to the important result that the open-loop gain $A(s=0)$ required to ensure precise control is further reduced with respect to classic control, since the current $I_{49}$ is limited like the voltage $V_{OSC,46}$, thus limiting the current supplied by the pump circuit to the gate terminal of the MOSFET transistor; in other words, the adjustment circuit thus gains in frequency stability. Finally, when the dissipative load drops below a certain value, thus increasing the gain, the pump circuit is completely off, i.e. $V_{OSC,46} = 0$.

This last fact is particularly advantageous, since the pump circuit is off, regardless of the value of the capacitor $C_{GS,40}$ or $C_{GS,80}$, precisely proximate to a high gain value, and thus in the conditions which are most critical for stability.

The invention thus conceived is susceptible to numerous modifications and variations, all of which are within the scope of the inventive concept. All the details may furthermore be replaced with other technically equivalent elements.

In practice, the materials employed and the dimensions may be any according to the requirements.

We claim:

1. Current control device particularly for power circuits in MOS technology, comprising an N-channel MOSFET transistor which has its source terminal connected to one terminal of a dissipative load whose other terminal is connected to the ground, its gate terminal connected to a pump circuit and its drain terminal connected to a power supply, said pump circuit receiving in input a supply voltage and a square-waveform voltage, and a control circuit which has at least one input coupled by means of an electrical connection to said N-channel MOSFET transistor and is suitable for adjusting the voltage between said gate terminal and said source terminal of said MOSFET transistor, said control circuit being suitable for generating signals for adjusting said supply voltage and said square-waveform voltage applied to inputs of said pump circuit.

2. Control device according to claim 1, wherein said adjustment signals are constituted by a current which is suitable for controlling the supply voltage of said pump circuit and by a signal which is suitable for continuously varying the amplitude of said square-waveform voltage.

3. Current control device particularly for power circuits in MOS technology, comprising a P-channel MOSFET transistor which has its source terminal connected to one terminal of a dissipative load whose other terminal is connected to a supply voltage, its gate terminal connected to a pump circuit and its drain terminal connected to a negative power supply, said pump circuit receiving in input a supply voltage and a square-waveform voltage, and a control circuit which has at least one input coupled by means of an electrical connection to said P-channel MOSFET transistor and is suitable for adjusting the voltage between said gate terminal and said source terminal of said MOSFET transistor, said control circuit being suitable for generating signals for adjusting said supply voltage and said square-waveform voltage applied to inputs of said pump circuit.

4. Control device according to claim 3, wherein said adjustment signals are constituted by a current which is suitable for controlling the supply voltage of said pump circuit and by a signal which is suitable for continuously varying the amplitude of said square-waveform voltage.

* * * * *